United States Patent [19]

Du Pont et al.

[11] Patent Number: 4,595,623

[45] Date of Patent: Jun. 17, 1986

[54] FIBER-REINFORCED SYNTACTIC FOAM COMPOSITES AND METHOD OF FORMING SAME

[75] Inventors: Preston S. Du Pont, Northridge; Janet E. Freeman, Pasadena; Robert E. Ritter, Palos Verdes Estates; Alois Wittmann, Palos Verdes, all of Calif.

[73] Assignee: Hughes Aircraft Company, Los Angeles, Calif.

[21] Appl. No.: 607,847

[22] Filed: May 7, 1984

[51] Int. Cl.$^4$ .............................................. B32B 3/00
[52] U.S. Cl. ................................... 428/195; 428/209; 521/54; 521/82; 521/99; 521/134; 521/135; 521/136; 521/138; 523/218; 523/219
[58] Field of Search ............... 521/54; 523/218, 219; 428/195, 209

[56] References Cited

U.S. PATENT DOCUMENTS

| | | | |
|---|---|---|---|
| 2,806,509 | 9/1957 | Bozzacco et al. | 521/54 |
| 3,230,184 | 1/1966 | Alford | 521/54 |
| 3,365,358 | 1/1968 | Hutchins | 521/54 |
| 3,553,002 | 1/1971 | Haraway, Jr. et al. | 521/54 |
| 3,730,920 | 5/1973 | D'Alessandro | 521/54 |
| 3,849,350 | 11/1974 | Matsko | 521/54 |
| 4,005,033 | 1/1977 | Georgeau et al. | 521/54 |
| 4,031,059 | 6/1977 | Strauss | 521/54 |
| 4,107,134 | 8/1978 | Dawans | 521/54 |
| 4,112,179 | 9/1978 | Maccalous et al. | 521/54 |
| 4,309,334 | 1/1982 | Valitsky | 521/54 |
| 4,361,453 | 11/1982 | Gagliani et al. | 521/54 |
| 4,363,883 | 12/1982 | Gagliani et al. | 521/54 |
| 4,410,639 | 10/1983 | Bouley | 521/54 |
| 4,412,012 | 10/1983 | Bouley et al. | 521/54 |
| 4,447,565 | 5/1984 | Lula et al. | 521/54 |

*Primary Examiner*—Morton Foelak
*Attorney, Agent, or Firm*—M. E. Lachman; A. W. Karambelas

[57] ABSTRACT

Fiber-reinforced syntactic foam composites having a low specific gravity and a low coefficient of thermal expansion suitable for forming lightweight structures for spacecraft applications are prepared from a mixture of a heat curable thermosetting resin, hollow microspheres having a diameter of about 5 to 200 micrometers and fibers having a length less than or equal to 250 micrometers.

39 Claims, No Drawings

FIBER-REINFORCED SYNTACTIC FOAM COMPOSITES AND METHOD OF FORMING SAME

BACKGROUND OF THE INVENTION

1. Field of the Invention

The present invention relates, in general, to syntactic foam composites and, more particularly, to fiber-reinforced thermosetting resin based syntactic foam composites exhibiting a low specific gravity and a low coefficient of thermal expansion.

2. Description of the Prior Art

A continuing objective in the development of satellites is to optimize satellite payload weight. One means of achieving this objective is to reduce the intrinsic weight of various operational elements within the spacecraft. It has been recognized by the art that the desired weight reduction could be realized by replacing conventional materials, such as aluminum, with lower density synthetic composites possessing requisite mechanical, thermal and chemical stability. Included in these low density synthetic composites is a group of materials referred to in the art as syntactic foams.

Syntactic foams are produced by dispersing microscopic rigid, hollow or solid particles in a liquid or semi-liquid thermosetting resin and then hardening the system by curing. The particles are generally spheres or microballoons of carbon, polystyrene, phenolic resin, urea-formaldehyde resin, glass, or silica, ranging from 20 to 200 micrometers in diameter. Commercial microspheres have specific gravities ranging from 0.033 to 0.33 for hollow spheres and up to 2.3 for solid glass spheres. The liquid resins used are the usual resins used in molding reinforced articles, e.g., epoxy resin, polyesters, and urea-formaldehyde resins.

In order to form such foams, the resin containing a curing agent therefor, and microspheres may be mixed to form a paste which is then cast into the desired shape and cured to form the foam. The latter method, as well as other known methods for forming syntactic foams, is described by Puterman et al in the publication entitled "Syntactic Foams I. Preparation, Structure, and Properties," in the *Journal of Cellular Plastics*, July/August 1980, pages 223-229. When fabricated in large-block form, such foams possess a compressive strength which has made them suitable for use in submerged structures. In addition, the more pliable versions of the foam are utilized as filler materials which, after hardening, function as a machinable, local-densification substance in applications such as automobile repair and the filling of structural honeycombs. Despite these characteristics of adequate compressive strength, good machineability, and light weight, such foams lack the degree of dimensional and thermal stability required to render them applicable for the spacecraft environment. More specifically, syntactic foam systems tend to exhibit varying filler orientation and distributions within the geometrical areas in a molded intricate structure, which limits the structural intricacy that can be achieved, as well as reducing dimensional stability. If syntactic foam systems are too highly filled, sacrifices are made in moldability, coefficient of thermal expansion, strength, density, dimensional stability and stiffness. Moreover, such foams tend to exhibit poor adhesion to metallic plating which is required to form the desired product, such as an antenna component.

In order for the syntactic foam to be useful as a substitute for aluminum in antenna and antenna microwave components in a spacecraft, the foam must have the following characteristics.

(1) The material must have a specific gravity of 1.00 or less, as compared to a specific gravity of 2.7 for aluminum.

(2) The material must have a linear coefficient of thermal expansion ($\alpha$ or CTE) comparable to that of aluminum, preferably close to $13 \times 10^{-6}$ in/in/°F. ($23 \times 10^{-6}$ cm/cm/°C.) or less. Thermal distortion of antenna components subjected to thermal cycling in the extremes of the space environment is a major contributing factor to gain loss, pointing errors, and phase shifts.

(3) The material must meet the National Aeronautics and Space Administration (NASA) outgassing requirements to insure that the material does not release gaseous component substances which undesirably accumulate on other spacecraft parts in the outer-space vacuum.

(4) The material must have long-term stability, as required for parts exposed to the space temperature environment (e.g., $-100°$ F. to $250°$ F. or $-73°$ C. to $121°$ C.) for extended periods of time, such as 10 years.

(5) The material must be capable of being cast into complex configurations in order to form component parts for antenna structures, such as waveguides or antenna feed distribution networks.

The art, until the present invention, has been unable to satisfy these requirements and particularly the requirement for a low coefficient of thermal expansion ($\alpha$). Thus, known epoxy resin based syntactic foams filled with 10 to 30% by volume hollow microspheres generally have a $\alpha$ in the range of 17 to $36 \times 10^{-6}$ in/in/°F. (30 to $65 \times 10^{-6}$ cm/cm/°C.).

A need, unsatisfied by existing technology, has thus developed for a syntactic foam material which is both lightweight and of sufficient mechanical, thermal and chemical stability to enable it to be substituted for aluminum in physically demanding satellite environments.

SUMMARY OF THE INVENTION

The unresolved needs of the art are satisfied by the present invention which provides thermally stable fiber-reinforced syntactic foam composites having a specific gravity of less than 1.0 and a linear coefficient of thermal expansion of about $25 \times 10^{-6}$ in/in/°F. ($45 \times 10^{-6}$ cm/cm/°C.) or less, which are prepared from an admixture of a heat curable thermosetting resin, hollow microspheres having a diameter between about 5 and about 200 micrometers and fibers having a length of about 50 to about 250 micrometers.

The syntactic foam composites of the present invention can be cast as complex structures which contain lightweight hollow microspheres having fibers, such as graphite fibers, in the voids between the microspheres, with the microspheres and fibers being bonded together by the heat cured resin matrix. The composites of the present invention readily meet the specific gravity, coefficient of thermal expansion and NASA outgassing requirements, which easily qualify the composites as aluminum substitutes for spacecraft use.

DETAILED DESCRIPTION OF THE INVENTION

In order to form the fiber-resin-microsphere composite of the present invention having the desired density and coefficient of thermal expansion, each of the three components must be selected so that the resulting combination thereof provides a mixture amenable to being cast into the desired configuration, as well as providing a final product having the required structural and physical properties. Acceptable mixtures must have a viscosity that produces an accurate, void-free casting with uniform material properties. In addition, the proportion of fiber in the composite must provide the required thermal expansion, strength, and stiffness properties. Further, the microsphere component must be chosen to provide the required low density in the composite. Finally, each of the components must be capable of being combined with the other components and the effect of each on the other in the mixture thereof, as well as in the final composite must be taken into account. In particular the properties of the composite are influenced by the properties, relative volume ratios, and interactions of the individual components. More specifically, density, strength, stiffness (brittleness), coefficient of thermal expansion and processability are strong functions of filler and fiber type, volume ratios and micropacking. The following discussion provides a more detailed consideration of these various factors. It should be noted that in the following discussion, the term "syntactic foam" is used herein to denote a filled polymer made by dispersing rigid, microscopic particles in a fluid polymer or resin and then curing the resin, as is known in the art. The term "fiber-reinforced syntactic foam composite" is used herein to denote the cured product formed from the mixture of resin, microballoons, and reinforcing fibers in accordance with the present invention.

1. Heat Curable Resin

The heat curable, thermosetting resins used to prepare the syntactic foam composites of the present invention can be any heat curable thermosetting resin having appropriate viscosity for casting (e.g., less than 1000 centipoise), pot life (e.g., greater than 2 hours), coefficient of thermal expansion, and thermal stability in the temperature range of −100° F. to 250° F. (−73° C. to 121° C.) required in the space environment. The resin material contains a curing agent which reacts with the resin to produce a hardened material. Curing agents and other additives will, of course affect the viscosity and other properties of the final mixture from which the composite is formed. Examples of suitable resins include low viscosity, polymerizable liquid polyester resins which comprise the product of the reaction of at least one polymerizable ethylenically unsaturated polycarboxylic acid, such as maleic acid or its anhydride, and a polyhydric alcohol, such as, for example, propylene glycol and optionally, one or more saturated polycarboxylic acids, such as, for example, phthalic acid or its anhydride. Other suitable resins include condensates of formaldehyde such as urea-formaldehyde, melamine-formaldehyde and phenol-formaldehyde resins. Preferred resins for use in the practice of the present invention are epoxy resins having 1,2 epoxy groups or mixtures of such resins, and include cycloaliphatic epoxy resins such as the glycidyl ethers of polyphenols, liquid Bisphenol-A diglycidyl ether epoxy resins (such as those sold under the trademarks Epon 815, Epon 825, Epon 828 by Shell Chemical Company), phenolformaldehyde novolac polyglycidyl ether epoxy resins (such as those sold under the trademarks DEN 431, DEN 438 and DEN 439 by Dow Chemical Company), and epoxy cresol novolacs (such as those sold under the trademarks ECN 1235, ECN 1273, ECN 1280 and ECN 1299 by Ciba Products Company).

The particular epoxy resins preferred in the practice of the present invention are polyglycidyl aromatic amines, i.e. N-glycidyl amino compounds prepared by reacting a halohydrin such as epichlorohydrin with an amine. Examples of the most preferred polyglycidyl aromatic amines include diglycidylaniline, diglycidyl orthotoluidine, tetraglycidyl ether of methylene dianiline and tetraglycidyl metaxylene diamine, or mixtures thereof.

The epoxy resins which are preferably in liquid form at room temperature are admixed with polyfunctional curing agents to provide heat curable epoxy resins which are cross-linkable at a moderate temperature, e.g., about 100° C., to form thermoset articles. Suitable polyfunctional curing agents for epoxy resins include aliphatic polyamines of which diethylene triamine and triethylene tetramine are exemplary; aromatic amines of which methylene dianiline, meta phenylene diamine, 4,4' diaminodiphenyl sulfone are exemplary; and polycarboxylic acid anhydrides of which pyromellitic dianhydride, benzophenone tetracarboxylic dianhydride, hexahydrophthalic anhydride, nadic methyl anhydride (maleic anhydride adduct of methyl cyclopentadiene), methyl tetrahydrophthalic anhydride and methyl hexahydrophthalic anhydride are exemplary. Polycarboxylic acid anhydride compounds are preferred curing agents for the above-noted preferred epoxy resins, with the three compounds last noted being most preferred.

In preparing heat curable, thermosetting, epoxy resins compositions, the epoxy resin is mixed with the curing agent in proportion from about 0.6 to about 1.0 of the stoichiometric proportions, which provides sufficient anhydride groups and carboxylic acid groups to react with from about 60 to 90 percent of the epoxide groups. The term "curing" as used herein denotes the conversion of the thermosetting resin into an insoluble and infusible cross-linked product and, in particular, as a rule, with simultaneous molding to give shaped articles.

In addition curing accelerators may be added to the epoxy resins, as is known in the art, to provide a low curing temperature. Preferred accelerators for the above-noted preferred polyglycidyl aromatic amine resins are substituted imidazoles, such as 2-ethyl-4-methyl imidazole, and organometallic compounds, such as stannous octoate, cobalt octoate, and dibutyl tin dilaurate which are incorporated at a concentration of zero to about 3 parts by weight per 100 parts resin.

Moreover, other materials may be added to the epoxy material in order to improve certain properties thereof, as is known in the art. For example, the tendency of the resin to separate from the mixture can be minimized by the addition of fine particulate fillers, such as Cab-O-Sil (a fumed silica manufactured by Cabot Corporation), acicular fibers, such as talc, or short chopped or milled fibers. In addition, resin penetration of the filler may be enhanced by the addition of a titanate wetting, agent, such as KR38S, an isopropyl tri(dioctylpyrophosphate) titanate, available from Kenrich Petrochemical Co.

A particularly useful resin composition for forming the composites of the present invention comprises a polyglycidyl aromatic amine, a polycarboxylic acid anhydride curing agent, and a curing accelerator, as described in copending patent application Ser. No. 608,615, assigned to the present assignee. Examples 3 and 4 herein are directed to the use of this preferred resin formulation in the practice of the present invention.

2. Hollow Microspheres

The syntactic foam composites prepared in accordance with the present invention contain a relatively uniform distribution of hollow microspheres. These hollow microspheres are usually hollow thermoplastic spheres composed of acrylic-type resins such as polymethylmethacrylate, acrylic modified styrene, polyvinylidene chloride or copolymers of styrene and methyl methacrylate; phenolic resins; or hollow glass, silica or carbon spheres that are very light in weight and act as a lightweight filler in the syntactic foam. These microspheres preferably have a diameter in the range of about 5 to about 200 micrometers. Methods for the production of these hollow microspheres are well known in the art and are discussed, for example, by Harry S. Katz and John V. Milewski in the book entitled, "Handbook of Fillers and Reinforcements for Plastics," Chapter 19: Hollow Spherical Fillers, Van Nostrand Reinhold, 1978, the teachings of which are incorporated herein by reference. Such microspheres are readily available commercially. These hollow microspheres can be compressed somewhat when subjected to external pressure. However, they are relatively fragile and will collapse or fracture at high pressures. Therefore, there is a pressure range under which the microspheres can effectively operate. It has been determined that when hollow glass microspheres are employed in the practice of the present invention, syntactic foam composites can be molded at pressures up to the limit of the hollow microspheres without fracture, with molding pressures in the range of about 700 to about 900 psi (0.102 to 0.131 pascals) being preferred.

By controlling the amount of hollow microspheres added to the syntactic foam, it is possible to control the specific gravity of the foam. A simple mixture of an epoxy material and hollow microspheres tends to separate on standing, with the microballoons rising to the surface of the epoxy. However, it has been found that with an increased volume of microballoons added to the epoxy, there is a decreased tendency to separate into discrete phases. Moreover, it has been found that at a sufficiently high loading of microballoons, namely about 65% by volume for microballoons, the tendency to separate into discrete phases is minimized. To achieve specific gravities of less than 1.0, the hollow microspheres are included in the syntactic foam in up to 65% by volume and generally in a range of about 35 to about 65% by volume and preferably about 50 to about 65% by volume. The volume percentage of hollow microspheres is adjusted based on the composition of the hollow microsphere selected, the brand of microspheres and the size of the microspheres. Therefore, it may be necessary to select the proper mixture of heat curable resin material and hollow microspheres for preparation of the syntactic foam on a trial and error basis. For example, the C15/250 series of glass microspheres available from the 3M Company has a specific gravity of 0.15 and a mean diameter of 50 micrometers. "Carbosphere" carbon microspheres available from the Versar Corporation have a specific gravity of 0.32 and a mean diameter of 50 micrometers. Desirably, a mixture of two or more types of hollow microspheres may be employed in the practice of the present invention. The glass microspheres provide the syntactic foam with improved structural strength, while those of carbon advantageously contribute to both a lowered coefficient of thermal expansion and greater amenability to subsequent metal-plating operations. When using a combination of glass and carbon microspheres in preparing the composites of the present invention, the ratio of glass microspheres to carbon microspheres is about 1:4 to 1:1.

Furthermore, it has been found by using packing theory that an increased volume percent solids in the resin mixture can be achieved. Packing theory is based on the concept that, since the largest particle size filler in a particular reinforcement system packs to produce the gross volume of the system, the addition of succeedingly smaller particles can be done in such a way as to simply occupy the voids between the larger filler without expanding the total volume. This theory is discussed by Harry S. Katz and John V. Milewski, in the book entitled "Handbook of Fillers and Reinforcements for Plastics," Chapter 4. Packing Concepts in Utilization of Filler and Reinforcement Combinations, Van Nostrand Reinhold, 1978. The fillers used in the present invention are chosen on the basis of particle size, shape, and contribution to overall composite properties. This theory applies to the use of solid particulates as well as hollow spheres. Because of the high viscosity of such a highly loaded resin, the mixture could not flow into the mold without damaging the microspheres. To overcome this problem, the mold is pre-packed with the dry filler (i.e. a mixture of microspheres and fibers). By applying packing theory as described above, the filler can be packed at high density and so that segregation of ingredients does not occur.

Finally, the microspheres may be advantageously treated with a coupling and wetting agent to enable the resin to wet the sphere surfaces and promote good filler-resin adhesion, as discussed in greater detail below with regard to similar treatment of the fibers used in the present invention.

3. Fibers

The fibers used in the practice of the present invention must be compatible with the selected resin in order to provide good coupling between the fiber and resin. Fibers such as graphite, glass, Kevlar (an aromatic polyamide material obtained from E. I. Dupont and Company) nylon, or carbon are added to the syntactic foam composite of the present invention to improve the strength and dimensional stability of the composite. However, the contribution of the fiber to the coefficient of thermal expansion of the composite product and to the viscosity of the mixture of components must also be considered. Graphite fibers have been found to be particularly useful since they provide the desired strength in the composite, while also reducing the coefficient of expansion of the composite. An additional factor to consider is fiber length. While shorter fibers (e.g. having a length-to-diameter ratio of less than 100:1) provide less reinforcement per fiber than do longer fibers, shorter fibers have less impact on the viscosity of the mixture. Thus, a greater volume fraction of shorter fibers can be incorporated into a mixture at a given level of viscosity, which provides a higher level of reinforcement at that viscosity level by shorter fibers. In addition, the use of shorter fibers improves the uniformity of the mix. Thus, fibers useful in the composite of the present invention have a length less than or equal to 250 micrometers and generally in the range of about 50 to about 250 micrometers. Fibers having a length about 150 to about 250 micrometers were found to provide the best compromise between viscosity and reinforcement as discussed previously. When graphite fiber, the preferred fiber material, is used, the diameter of the graphite fibers is in the range of about 5 to about 10 micrometers.

Moreover, the interaction of the fibers with the microspheres discussed previously must be considered. It has been determined by micropacking theory, as described in Chapter 4 of the book by Katz and Milewski, previously referenced, that the optimum ratio of fibers-to-spheres varies with the length/diameter ratio (L/D) of the fibers and with the ratio of the sphere-diameter to the fiber-diameter (R). For each value of L/D, there is one R value where the packing efficiency is zero; and as R increases or decreases on either side of this minimum, packing efficiency increases. It has been found most desirable in the practice of the present invention to use graphite fibers of the micrometer lengths discussed above, which have a length to diameter ratio (L/D) of about 5:1 to about 30:1 and preferably about 15:1 to about 30:1, and a sphere-diameter to fiber-diameter ratio (R) of at least about 6:1 and preferably about 15:1.

Graphite fibers used in the practice of the present invention are selected to have high strength and low density. Celanese GY-70 graphite fiber and Courtaulds HM-S graphite fiber are especially suitable. Celanese GY-70 fiber is 8 micrometers in diameter, has a tensile strength of 76,000 pounds per square inch ($3.6389 \times 10^6$ Pa), a specific gravity of 1.83 gm/cm$^3$ and an $\alpha$ of $-0.3 \times 10^{-6}$ in/in/°F. Courtaulds HM-S graphite fibers have a diameter of 8 micrometers, a tensile strength of 50,000 psi ($2.394 \times 10^6$ Pa), a specific gravity of 1.91 gm/cm$^3$ and a longitudinal $\alpha$ of $-1 \times 10^{-6}$ in/in/°F. The graphite fibers are commercially available as continuous-fiber tows. For example, Celanese GY-70 fiber consists of 384 fibers/tow. The fiber tows are reducible to required lengths on the order of between about 50 micrometers and 250 micrometers by ball milling or from commercial processing concerns such as the Courtaulds Company of the United Kingdom.

The amount of fiber incorporated in the resin-microsphere admixture generally ranges from about 3 to about 10 volume percent and preferably from about 3 to about 5 volume percent in order to achieve composites having $\alpha$ values of $25 \times 10^{-6}$ in/in/°F. ($45 \times 10^{-6}$ cm/cm/°C.) or less.

As the amount of hollow microspheres and fibers incorporated in the heat curable resin increases, there is a corresponding increase in the viscosity of the resin. High viscosity prevents uniform dispersion of the microspheres and fibers and interferes with the processing of the resin-microsphere-fiber mixture during molding operations. However, in order to reduce the viscosity of the mixture, the surfaces of the microspheres and fibers may be provided with a thin layer of coupling and wetting agents. The microsphere and fiber surfaces are treated with a solution containing a silane coupling agent such as Silane A-186 (beta(-3,4-epoxy cyclohexyl)-ethyltrimethoxy silane), Silane A-1120 (n-beta-(aminoethyl)-gamma-aminopropyl tri-methoxy-silane) or a titanate coupling agent such as di(dioctylpyrophosphato)ethylene titanate (KR238M available from Kenrich Petrochemical Company of Bayonne, N.J.); or tetra(2,2 diallyloxymethyl-1-butoxy)titanium di(ditridecyl phosphite) (KR55 available from Kenrich); or titanium di(cumylphenylate)oxyacetate (KR134S available from Kenrich); or isopropyl tridodecylbenzenesulfonyl (KR9S available from Kenrich). The coupling agents enable the resin to wet the sphere and fiber surfaces, and promote a stronger bond between the resin, microspheres, and fibers without increasing the viscosity appreciably.

The coupling agents may be applied by simply dissolving the agents in the resin-microsphere-fiber blend. Optionally, these agents may be applied by first dissolving the agents at a concentration of 0.1–0.5% of the filler weight in water or an organic solvent such as isopropanol or Freon TE (a fluorocarbon compound available from E.I. Dupont and Company); and then immersing the microspheres and fibers which have been premixed in predetermined proportions in the solution for a period of 5 to 30 minutes, followed by filtering and drying the mixture. The microsphere-fiber mixture may then be blended with the heat curable resin preparatory to fabricating the syntactic foam composite.

3. Optional Microbeads

Solid microbeads may optionally be incorporated in the composite of the present invention in order to increase packing efficiency. Advantageously, such microbeads were also found to decrease the viscosity of the formulation, improve its pourability, and increase composite uniformity. In a preferred practice of the present invention, about 2 to about 8 percent by volume of solid inert material, such as glass or silica microbeads having a diameter of about 2 to about 8 micrometers and a specific gravity of 2.2 to 2.4 are incorporated in the resin-microsphere-fiber admixture. Volume percentages in excess of 8% increase the viscosity of the uncured, filled heat curable resin formulation to a level at which it is unworkable for molding purposes. In addition, it was found that large filler volume fractions (volume of microballoons, fiber and microbeads greater than 60 percent) had a reduced coefficient of thermal expansion, but the viscosity of the mix was unworkable. Small volume fractions of filler (i.e. volume of microballoons, fiber, and microbeads less then 40 percent) were found to improve processability, but increased the coefficient of thermal expansion to an unacceptable level. However, by choosing a filler combination that maximized filler volume yet minimized filler surface area, both viscosity and the coefficient of thermal expansion were reduced. Such a combination was used in the reinforced syntactic foam RSF-34F shown in Table III, which was processable, uniform, had good physical properties, and was successfully cast in a metal mold.

In preparing syntactic foams by the method of the present invention, the hollow microspheres and graphite fibers, and optionally the solid microbeads, are admixed with the heat curable resin in any conventional fashion using a suitable mixing device such as a Waring blender. The homogeneous admixture is then degassed as by appyling a vacuum. Then the mixture is loaded into a mold of suitable configuration from a reservoir or by using an air gun or other conventional loading device. The shape of the mold will, of course, determine the shape of the cured product and may be chosen as required to form a desired structure, such as an antenna waveguide. Molding is then accomplished in an autoclave at the temperature at which the resin is curable, e.g. to 250° F. to 350° F. (121° C. to 177° C.), for epoxy resins generally and about 150° F. to 250° F. (66° to 121° C.) for the preferred epoxy composition described herein, at 50 to 100 psi (2586 to 5171 mm Hg or 7.25 to $14.5 \times 10^{-3}$ Pa) for about 2 to about 4 hours.

Molding of the filled heat curable resin formulations to form syntactic foam composites of the present invention may also be effected by other conventional molding methods including transfer molding and compression molding procedures wherein the heat curable formulation is cured at the above-noted curing temperatures, using pressures on the order of 800 to 1000 psi (41,372 to 51,715 mm Hg or 0.116 to 0.145 pascals) for 1 to 2 hours.

It has been found particularly advantageous to form the filled heat curable resin mixtures into the syntactic foam composites of the present invention by the vacuum liquid transfer molding process disclosed in copending patent application Ser. No. 608,614, assigned to the present assignee. In this procedure, the mold is first loaded with the microsphere/fiber filler which has been mechanically or manually premixed in predetermined proportions and pretreated with a sizing agent as previously described. Next, the mold may optionally be vibrated to promote a uniform distribution of the filler in the mold (e.g. about 5 minutes on a vibration table). Then the mold cavity is filled with the heat curable resin. The mold is a sealable pressure vessel constructed to support the vacuum/pressure sequence described below. To prepare for the molding process, the mold cavity is preheated to bring the cavity up to the temperature at which the heat curable resin is curable. A vacuum is then drawn on the mold to degas the mold cavity contents and to impregnate the filler with the resin. The vacuum is released to atmospheric pressure to burst any gas bubbles remaining in the mold contents. Then, a superatmospheric pressure, such as 100 to 1000 psi (0.01456 to 0.145 pascals), is applied to the mold to cause the resin to encapsulate the filler. The elevated temperature and superatmospheric pressure are maintained for a time sufficient to partially cure the resin and form a unitary structure which can be ejected from the mold. The ejected structure is then subjected to a further heating cycle to completely cure the resin.

By the practice of the present invention, reinforced syntactic foam composites are obtained which have a coefficient of thermal expansion of about $25 \times 10^{-6}$ in/in/°F. ($45 \times 10^{-6}$ cm/cm/°C.) or less and a density of less than 1.0 gm/cm$^3$, as well as long-term thermal stability, amenability to being molded in various configurations, and ability to meet the NASA outgassing requirements. In addition, the mechanical properties of these composites are repeatable. This combination of properties makes the composites of the present invention particularly well suited for use as a substitute for aluminum in antenna and antenna microwave components used in space applications. In particular, heat curable epoxy resins comprised of mixtures of tetrafunctional aromatic epoxy resins and liquid anhydride when heated to 150° F. are sufficiently low in viscosity to accept loadings of microspheres up to 65 percent of the volume of the system, fiber loadings of up to 10 percent, and bead loadings up to 65 percent. These microsphere/fiber/bead filled epoxy resins are readily curable and when cured produce syntactic foam composites having specific gravities of between 0.8 and 0.9 and coefficients of thermal expansion approximating that of aluminum or steel. Depending on the filler fiber volume used in the composite of the present invention, composites may be tailored to have coefficients of thermal expansion ranging from that of the unfilled resin to that of steel.

Because of their relatively low coefficient of thermal expansion, epoxy resin based syntactic foam composites prepared in accordance with the present invention have been determined to be especially amenable to conventional metal plating processes, such as electroless plating, when the surfaces thereof are prepared for plating by plasma treatment. The relatively high adhesion of metal deposits to the surface of the present composite is believed to be a function of both the topography of the plasma-treated surface plus the mechanical integrity of the remaining surface. The plasma removes the resin "skin" from the composite, leaving the graphite fiber/microballoon filler exposed, to provide a surface which is readily platable. Such metal plating of the composite of the present invention may be required in forming antenna components in which an electrically conductive surface or path is required, as is known in the art.

To effect plasma treatment in preparation for plating, the surface of the filler reinforced epoxy resin based composite is subjected to a plasma process with a reaction gas containing a mixture of air, nitrogen, or argon with oxygen, water vapor, nitrous oxide, or other resin oxidizing source, to remove the polymer "skin" and expose the filler, as discussed above. Normal plasma etching conditions known to the art are used. For example, for a plasma excitation energy of 200 watts/ft$^2$ of composite, an $O_2$/inert gas source of approximately 1000 ml/minute, a vacuum pressure of 200 micrometers Hg, and one hour duration are used.

When a silver deposit is required, as in an antenna waveguide structure, it is advantageous to first form a layer of an electroless or vapor deposited metal such as copper to provide a conductive surface which can then be built up with additional electrolytic plating such as copper or silver plate to produce a smooth surface finish. Electrolytic silver plating may readily be formed on the electrolytic copper surface to provide a silver plated surface with good adhesion to the underlying composite material.

Electroless plating of the plasma-treated composite surface can be accomplished by standard procedures such as by dipping the plasma-treated composite in the plating solution for a time sufficient to achieve a continuous buildup of metal on the etched surface. Metals that can be plated on the molded epoxy resin based composites prepared in accordance with the present invention include, for example, copper, silver, nickel, cobalt, nickel/iron, nickel/cobalt, other nickel alloys, and gold. For electroless copper plating, an aqueous bath of Shipley Co. #328 copper plating solution may be used, which contains copper sulfate, sodium potassium tartrate, and sodium hydroxide. Other electroless copper plating formulations can also be employed. The plating bath is agitated or stirred prior to immersion of the plasma-treated composite. Preferred plating temperatures are in the range of about 15° C. to about 95° C. (about 59° F. to 203° F.). Metal adhesion of this electroless copper plating has been determined to be excellent even after exposure of the plated composite to cycles of widely different temperatures, as described in Examples 3 and 4 herein.

Next, a copper plating is built up to any desired thickness on the electroless copper by known electrolytic plating methods, using commercially available electrodeposit copper plating solution. Finally an electrolytic silver plate is formed to the desired thickness on the electrolytic copper plate by known methods, using commercially available silver plating solution formulations. Silver plating of a composite of the present invention is described in Example 5.

The following examples illustrate but do not limit the present invention.

EXAMPLE 1

This example illustrates a process for forming one type of fiber-reinforced syntactic foam composite in accordance with one process embodiment of the present invention.

The components of the syntactic foam formulation designated "S-61" are shown in Table I. The following details regarding the components of S-61 apply to Table I.

a. MY720 is a tetraglycidyl methylene dianiline manufactured by Ciba Geigy.
b. HY906 is a nadic methyl anhydride hardener manufactured by Ciba Geigy.
c. BDMA is benzyldimethylamine accelerator available from E. V. Roberts or Ciba Geigy.
d. D32/4500 microspheres are borosilicate microspheres having a mean diameter of 75 micrometers, a specific gravity of 0.32, and a compressive strength of 4500 psi, available from the 3M Company.
e. GY70 fibers are graphite fibers milled to a length of about 150 micrometers and having a diameter of about 8 micrometers, available from the Celanese Corporation.
f. KR38S, KR55, and KR9S are titanate coupling and wetting agents, available from Kenrich Petrochemical Company, Bayonne, N.J.
g. AF4 is a surfactant, available from Furane Chemical Co.

TABLE I

| COMPOSITION OF FORMULATION S61 | | |
|---|---|---|
| Component | PHR* | Weight (grams) |
| 1. Resin | | |
| MY720 epoxy resin | 100 | 400 |
| HY906 hardener | 100 | 1.0 |
| BDMA accelerator | 0.25 | 4.0 |
| KR38S | 1.0 | 4.0 |
| 2. Microspheres | | |
| D32/4500 | 40 | 160 |
| KR55 | 0.3 | 1.2 |
| AF4 (Optional) | 0.2 | 0.8 |
| 3. Fibers | | |
| Milled GY70 | 20 | 80 |
| KR9S | 0.2 | 0.8 |

*PHR is parts per hundred epoxy resin

PREPARATION OF GRAPHITE FIBERS

The GY70 graphite fibers in continuous tow form were cut into lengths of approximately ⅛ inch to ½ inch (0.32 to 1.27 centimeters), using a paper cutter. Batches of the chopped fibers (approximately 80 grams each) were loaded into a ball mill jar having a one-gallon capacity and sufficient Freon TF was added to cover the ceramic balls to serve as a suspension medium. The fibers were milled for 24 hours. Scanning electron micrographs of the milled fibers showed them to be broken into small fragments ranging from approximately 2 to 10 micrometers in length.

The milled fibers and Freon were poured into a shallow stainless steel pan, and the Freon was allowed to evaporate. The fibers were then dried 4 hours in an air-circulating oven set at 250° F. (121° C.) and sifted on a vibration plate to pass a 325 mesh screen. The dried, sifted fibers were stored in a desiccator box until ready for use.

COMPOSITE FORMATION

The formulation S61 was prepared as follows. A one-gallon hot/cold pot for a Waring blender was heated to 140° F. (60° C.) using a temperature-controlled water bath. The premeasured amount of the HY906 hardener was put in the blender and the mixer speed was adjusted using a Variac variable potentiometer so that the hardener was just barely agitated. With the blender on "low" setting, the Variac was turned to 70 percent of full speed. The resin, which had been preheated to 160° F. (71° C.), was added to the pot and the contents of the pot were mixed until the mixture appeared homogeneous (about 5 minutes), and then cooled to room temperature. Next, there was gradually added to the pot the KR38S, AF4 (optional), and 25 percent of the milled fibers which had been previously dried overnight in an oven at 200° F. (93° C.) and fluffed by running in the blender on "low" speed at 70 percent of the full Variac speed for about 15 seconds for 5 grams of fiber. The mixture was mixed for about 5 minutes. Next, 10 percent of the microspheres which had been dried overnight in an oven at 200° F. (93° C.) was gradually added and the contents of the pot were mixed until streaks of microspheres disappeared. The remaining amount of fiber and the KR9S were gradually added and the pot contents mixed for about 30 minutes. Next, the BDMA was added slowly, followed by the KR55 and the remaining amount of microspheres. The pot contents were mixed until streaks of microspheres disappeared.

Then, the pot was covered and a vacuum pump was attached to the pot with the pump set to pull a vacuum of 22 inches (559 mm) of mercury. The mixer was run for 45 minutes under vacuum or until there were no black streaks of fibers in the mixture. Finally, the mixture was carefully poured so as to minimize air entrapment, into a preheated stainless steel test specimen mold which had been prepared by: cleaning with methyl ethyl ketone solvent, baking at 300° F. (149° C.) for 30 minutes, brushing with a fluorocarbon mold release agent to provide three coats of the release agent with 30 minutes air drying for each coat, and preheating to 140° F. (60° C.) (Optionally, the formulation was injected with an air gun into the mold.) After pouring the mixture into the mold, the mold was vibrated on a vibrating table for 5 minutes at the maximum safe speed, with a large, flat, 0.5 inch thick aluminum plate placed on top of the mold. Next, the mold was placed in an oven preheated to 275° F. (135° C.) and a thermocouple was placed on/in each of the following: on the mold, in the oven, and in the mold contents through a hole in the side wall of the mold. When the thermocouple in the mold contents registered 275° F. (135° C.), the following cure cycle was run: 10 minutes at 275° F. (135° C.); 10 minutes at 300° F. (149° C.); 120 minutes at 350° F. (177° C.). The maximum oven rate was used for changing temperatures.

The mold was removed from the oven and was disassembled, and the part was removed from the mold while the mold was still hot, being sure to keep the thermocouple embedded in the syntactic foam. The part was deflashed as necessary with a file. For the postcure, the demolded part was placed in an oven preheated to 400° F. (204° C.) between 0.5 inch thick aluminum plates, with 2–5 kilograms weight on the top plate.

When the thermocouple in the syntactic foam registered 400° F. (204° C.), the following post-cure cycle was run: 1 hour at 400° F. (204° C.); 1 hour at 424° F. (218° C.); 1 hour at 450° F. (232° C.), and 1 hour at 475° F. (246° C.) Finally, the part was removed from the oven.

The fiber reinforced syntactic foam composite formed as described above was found to have the properties shown in Table II. With regard to Table II, the following test requirements apply:

a. CTE was determined using a quartz dilatometer to measure the change in length as a function of temperature.
b. Specific gravity was measured using a pycnometer.
c. Viscosity was measured with a Brookfield Viscometer.
d. Shrinkage was measured by determining the dimensional difference between the molded product and the mold.
e. Gel time was determined qualitatively as the time required for the liquid resin to form a gel.
f. Pot life was determined qualitatively as the time required for the liquid resin to increase in viscosity to the point of being unworkable.
g. Degree of exotherm was determined by using a differential scanning calorimeter.

TABLE II

PROPERTIES OF COMPOSITE OF S61 FORMULATION

| Property | Value |
|---|---|
| CTE | 19-22 × $10^{-6}$ cm/cm/°C. |
|  | 10.6-12.7 × $10^{-6}$ in/in/°F. |
| Specific gravity | 0.80 |
| Viscosity at 150° F. (65.6° C.) | 35,000 centipoise |
| Shrinkage | 0.8% |
| Gel time | >60 minutes |
| Pot life | >360 minutes |
| Degree of exotherm | 15° F. (8.3° C.) |

EXAMPLE 2

This example illustrates a process for forming fiber-reinforced syntactic foam composites of various compositions in accordance with the present invention.

The components of the various formulations designated as the "RSF series" are shown in Table III. The following details regarding the specific components apply to Table III.

a. Epoxy is a mixture of 70 parts Glyamine 135 (diglycidyl ortho toluidine) and 30 parts Glyamine 120 (tetraglycidyl methylene dianiline), both materials obtained from FIC Resins of San Francisco, Calif., mixed with about 115 parts nadic methyl anhydride hardener and about 0.25 parts benzyldimethylaniline accelerator.

b. Zeeospheres 0/8 are solid glass spheres having a median diameter of 3 micrometers, available from Zeelan Industries of St. Paul, Minn.
c. Carbospheres Type A are hollow carbon spheres having an average diameter of 50 micrometers, available from Versar of Springfield, Va.
d. 3M A 32/2500 glass bubbles are glass microspheres having a mean diameter of 50 micrometers, a specific gravity of 0.32, and a compressive strength of 2500 psi, available from the 3M Company of Minnesota.
e. 3M A 16/500 are glass microspheres having a mean diameter of 75 micrometers, a specific gravity of 0.16, and a compressive strength of 500 psi, available from the 3M Company.
f. Eccospheres SI are hollow silica microspheres having a diameter of 45-125 micrometers, available from Emerson and Cuming Inc. of Canton, Mass.
g. Grefco 213 R40 beads are solid glass microspheres having a diameter of 3-8 micrometers, available from Grefco Inc. of Torrance, Calif.
h. HM-S 50 (50μ) are graphite fibers having a length of about 50 micrometers and a diameter of about 8 micrometers, available from Courtaulds Co. of the United Kingdom.
i. AS 50 (250μ) graphite are graphite fibers having a length of about 250 micrometers and a diameter of about 8 micrometers, available from Courtaulds of the United Kingdom.
j. 0.063" HMS-50 (1/16") are graphite fibers having a length of about 1600 micrometers and a diameter of about 8 micrometers, available Finn and Fram of Sun Valley, Calif.

Using each of the formulations of the RSF series designated in Table III, a fiber-reinforced syntactic foam composite was formed following the general procedure set forth in Example 1. The properties of each of these composites is shown in Table IV. The following test requirements were applied for the measurements in Table IV.

a. Density was determined by pycnometer.
b. CTE was determined using a quartz dilatometer to measure the change in length (Δl) as a function of temperature.
c. Compressive strength was determined using the American Society for Testing and Materials (ASTM) Standard No. D695.
d. Compressive modulus was determined using ASTM D695, using crosshead speed in place of strain gauges.
e. Uniformity was determined by visual inspection.
f. Viscosity was measured with a Brookfield Viscometer.

TABLE III

COMPOSITION OF FORMULATIONS OF RSF SERIES
VOLUME RATIO OF FOAM FILLERS

| RSF-FORMU-LATION | EPOXY | MICROSPHERES | | | | | FIBERS | |
|---|---|---|---|---|---|---|---|---|
| | | ZEEO-SPHERES 0/8 | CARBO-SPHERES TYPE A | 3M A32/2500 GLASS BUBBLES | ECCOSPHERES SI | GREFCO 213 R 40 BEADS | HM-S 50μ GRAPHITE | 0.063" HMS-50 (1/16") |
| 3 | 0.405 | 0.098 | | 0.471 | | | 0.025 | |
| 4 | 0.375 | 0.048 | | 0.514 | | | 0.064 | |
| 5 | 0.401 | | | 0.500 | | 0.059 | 0.040 | |
| 6 | 0.401 | | | 0.500 | | 0.059 | 0.034* | |
| 7 | 0.536 | 0.057 | | 0.400 | | | | 0.007 |
| 8 | 0.530 | 0.057 | | 0.395 | | | | 0.018 |
| 13 | 0.536 | 0.057 | | 0.400 | | | 0.007 | |
| 14 | 0.530 | 0.057 | | 0.395 | | | 0.018 | |
| 19 | 0.37 | 0.05 | | 0.51 | | | 0.06 | |

TABLE III-continued

COMPOSITION OF FORMULATIONS OF RSF SERIES
VOLUME RATIO OF FOAM FILLERS

| RSF-FORMU-LATION | EPOXY | MICROSPHERES ZEEO-SPHERES 0/8 | CARBO-SPHERES TYPE A | 3M A32/2500 GLASS BUBBLES | ECCOSPHERES SI | GREFCO 213 R 40 BEADS | FIBERS HM-S 50μ GRAPHITE | 0.063" HMS-50 (1/16") |
|---|---|---|---|---|---|---|---|---|
| 20 | 0.322 | 0.041 | | | 0.586 | | 0.050 | |
| 21 | 0.375 | 0.048 | | 0.514 | | | 0.064 | |
| 23 | 0.583 | 0.023 | 0.368 | | | | 0.026 | |
| 25 | 0.503 | 0.022 | 0.450 | | | | 0.025 | |
| 26 | 0.583 | 0.023 | 0.368 | | | | 0.026 | |
| 28 | 0.583 | 0.023 | 0.368 | | | | 0.026 | |
| 29 | 0.583 | 0.023 | 0.368 | | | | 0.026 | |
| 31 | 0.496 | 0.022 | | 0.457 | | | 0.025 | |
| 33 | 0.503 | 0.022 | | | | 0.450 | 0.025 | |
| 34 | 0.394 | 0.026 | | 0.550 | | | 0.030 | |
| 34F | 0.410 | 0.025 | | 0.530 | | | 0.035 | |
| 35 | 0.353 | 0.028 | | 0.588** | | | 0.032 | |
| 36 | 0.383 | 0.026 | | | 0.560 | | 0.031 | |

*Plus 0.007 of AS 50 (250μ) graphite
**3M A16/500 used in place of A32/2500

TABLE IV

PROPERTIES OF COMPOSITES OF FORMULATIONS OF RSF SERIES

| RSF-FORMULATION | DENSITY (g/cc) | CTE ($10^{-6}$ in/in/°F.) | COMPRESSIVE STRENGTH (psi)* | COMPRESSIVE MODULUS ($10^3$ psi)* | UNIFORMITY (1–10) | VISCOSITY |
|---|---|---|---|---|---|---|
| 3 | 0.898 | 16.82 | 15,300 | 394 | 3.7 | 5 |
| 4 | 0.881 | 13.81 | 16,300 | 447 | 4.3 | 4 |
| 5 | 0.872 | 15.10 | 16,400 | 406 | 4.0 | 4 |
| 6 | 0.869 | 22.16 | 14,300 | 407 | 3.5 | 5 |
| 7 | 0.968 | 20.82 | 15,100 | 394 | 2.7 | 8 |
| 8 | 0.982 | 21.39 | 18,400 | 410 | 4.7 | 7 |
| 13 | 1.000 | 25.46 | 14,900 | 386 | 2.3 | 7 |
| 14 | 1.019 | 25.55 | 15,400 | 405 | 1.8 | 6 |
| 19 | 0.852 | 14.06 | 13,200 | 411 | 4.0 | 3 |
| 20 | 0.694 | 14.09 | 8,600 | 335 | 2.7 | 2 |
| 21 | 0.8561 | 17.02 | 14,000 | 439 | 3.4 | 3 |
| 23 | 0.9912 | 20.69 | 16,300 | 384 | 5.5 | 7 |
| 25 | 1.0387 | 30.51 | 19,000 | 423 | — | 6 |
| 26 | 1.005 | 21.73 | 15,700 | 395 | 7.3 | 5 |
| 28 | 0.982 | 20.10 | 17,100 | 411 | 6.5 | 5 |
| 29 | 1.002 | 20.70 | 17,800 | 393 | 7.6 | 5 |
| 31 | 0.888 | 23.90 | 17,800 | 400 | 6.6 | 8 |
| 33 | 0.815 | 23.10 | 13,300 | 343 | 3.9 | 7 |
| 34 | 0.824 | 14.59 | 17,500 | 394 | 4.4 | 6 |
| 34F | 0.842 | 14.24 | 17,300 | 425 | — | — |
| 35 | 0.738 | 17.23 | 10,200 | 303 | 4.0 | 6 |
| 36 | 0.745 | 17.14 | 12,100 | 335 | 3.0 | 5 |

*1 psi = $1.45 \times 10^{-4}$ pascals

EXAMPLE 3

This example illustrates the formation of a fiber-reinforced syntactic foam composite using the preferred epoxy resin formulation and preferred vacuum liquid transfer molding process described herein, and which composite is also set forth in copending patent application Ser. No. 609,178, assigned to the present assignee.

The heat curable epoxy resin formulation was prepared as disclosed in copending patent application Ser. No. 608,615 and had the following composition:

| Resin Component | WT. (gms.) |
|---|---|
| Diglycidyl orthotoluidine | 100 |
| Nadic methylanhydride | 100 |
| 2-ethyl-4-methyl imidazole | 2 |

This composition had a gel time of 25 minutes, a viscosity of 220 centipoise at 75° F. (24° C.), and a CTE of 30.8 to $32.3 \times 10^{-6}$ in/in/°F. (55.8 to $58.1 \times 10^{-6}$ cm/cm/°C.).

A filler mixture was prepared having the composition shown below and a density of 0.543 gm/cm³. Carbospheres are hollow carbon microballoons having a mean diameter of about 50 micrometers, available from Versar Inc. of Springfield, Va. HM-S graphite fibers are graphite fibers having a length of about 50 micrometers, available from Courtaulds Co. of the United Kingdom. Titanate sizing agents are available from Kenrich Petrochemical Co. of Bayonne, N.J.

| Filler Component | WT. (gms.) |
|---|---|
| Carbosphere, 50 micrometers | 50 |
| HM-S fiber, 50 micrometers | 50 |
| Titanate sizing agent KR238M | 1 |

Using the above-noted resin and filler, each of a series of resin/filler formulations shown in Table V was processed as described below in order to form the composite of the present invention.

The filler composition (i.e. a mixture of the fibers and microspheres pretreated with the sizing agent as previously described herein) was loaded into a cleaned 5.5 inch×0.5 inch (14 cm×1.3 cm) wide slab mold internally coated with a polyvinyl alcohol release agent. The mold was preheated to 212° F. (100° C.), the temperature at which hardening of the heat curable epoxy resin formulation was initiated. The epoxy resin formulation was poured into the mold containing the filler. The mold was placed in a laminating press, a nylon vacuum bag was constructed around the compression tooling of the press, and a vacuum pressure of 125 millimeters (mm) mercury pressure (166,625 pascals) was maintained on the assembly for 2 minutes to draw down the resin to impregnate the filler and to degas the resin materials in the mold. The vacuum was then released without removal of the vacuum bag and the assembly held in this passive vacuum state for an additional 2 minutes. Thereafter, a constant positive pressure of approximately 800 pounds per square inch (41,360 mm Hg or $5.5 \times 10^6$ pascals) was imposed on the resin/filler mixture in the mold for 2 hours at 212° F. (100° C.). During this pressurization stage, the resin was bled from the mold in the amount noted in Table V. The molded composite slab had sufficient green strength to be ejected from the mold, whereafter it was post cured for 4 hours unrestrained, in an oven set at 300° F. (149° C.). The final void-free slab contained the filler ratio noted in Table V and was cut into appropriate shapes for physical testing. The composite was found to have the physical properties which are summarized in Table VI. As indicated by the values for CTE given in Table VI, unexpected significant improvement in the CTE of these composites was obtained using the preferred resin composition and filler compositions described herein.

In addition, a typical sample was tested in accordance with ASTM E-595-77 and found to have a collected volatile condensible material (CVCM) of less than 0.1 percent and a total mass loss (TML) of less than 1 percent, which meets the NASA outgassing requirements.

Further, for Specimen 1 of Table V, a portion of the molded slab was surface plated with copper by subjecting the surface of the slab to an oxygen rich plasma treatment, as previously described. The treated slab was then dipped into Shipley #328, electroless copper plating solution, as previously described, and then dried at 248° F. (120° C.) under 29 inches (737 mm) Hg (guage pressure).

The plated composite was then evaluated for adhesion of the deposited copper layer using an ASTM D3359 tape adhesion test before and after 25 cycles of thermal shock imposed on the plated surface by alternately dipping the plated specimen in liquid nitrogen (−320° F. or −196° C.) for 30 seconds and boiling water (212° F. or 100° C.) for 10 seconds. No loss of copper was observed.

TABLE V

COMPONENTS OF MOLDING COMPOSITION

| Specimen No. | Resin (gms.) | Filler (gms.) | Filler Ratio (Wt. %) | Filler Ratio (Vol. %) | Resin Bleed During Molding % |
|---|---|---|---|---|---|
| 1 | 40 | 10 | 45 | 64 | 69.2 |
| 2 | 30 | 9.4 | 38 | 57 | 47.8 |
| 3 | 30 | 9.4 | 38 | 57 | 47.9 |
| 4 | 17.0* | 5.5 | 37 | 57 | 45.3 |
| 5 | 19.0* | 6.0 | 39 | 59 | 50.6 |
| 6 | 20.7* | 6.5 | 41 | 60 | 54.6 |

*KR134S sizing agent was substituted for the previously noted sizing agent.

**Resin bleed $= \left(\dfrac{W_1 - W_2}{W_1}\right) 100$ where $W_1$ = initial resin weight
$W_2$ = resin displaced from the mold, using a bleeder cloth.
Vol. % calculated from resin bleed varies about 10–20% of the actual vol. % value.

TABLE VI

PHYSICAL PROPERTIES OF MOLDED COMPOSITES

| Specimen No. | Thickness (in.) | Density gm/cm³ | CTE* $10^{-6}$ cm/cm/°C. ($10^{-6}$ in/in/°F.) |
|---|---|---|---|
| 1 | 0.478 | 0.743 | 6.6 (3.6) |
| 2 | 0.550 | 0.900 | 16.2 (9.0) |
| 3 | 0.565 | 0.876 | 14.2 (8.1) |
| 4 | 1.070 | 0.889 | — |
| 5 | 1.042 | 0.915 | — |
| 6 | 1.065 | 0.914 | — |

*Determined using a quartz dilatometer.

EXAMPLE 4

This example illustrates the formation of composites as set forth in Example 3 with the exception that the composition of the filler formulation was varied. The procedure set forth in Example 3 was followed except that the filler compositions shown in Table VII were used. These composites are also set forth in copending patent application Ser. No. 609,178 previously referenced. The following details regarding the specific components apply to Table VII.

a. Carbospheres are carbon microspheres having a specific gravity of 0.32 and a mean diameter of 50 micrometers, available from Versar Corporation.

b. HM-S 50 (50μ) graphite fibers are graphite fibers having a length of about 50 micrometers and a diameter of about 8 micrometers, available from the Courtaulds Co. of the United Kingdom.

c. ¼ mm HM-S 50 graphite fibers are graphite fibers having a length of about 250 micrometers and a diameter of about 8 micrometers, available from the Courtaulds Co. of the United Kingdom.

d. C15/250 glass microballoons are composed of borosilicate glass, have a diameter of 10–200 micrometers, a density of 0.15 gm/cm³, and a compressive strength of 250 psi, available from the 3M Company of Minnesota.

The physical properties of the molded composite slabs so formed are set forth in Table VIII.

TABLE VII

COMPOSITION OF FILLER FORMULATIONS

| Filler No. | Density (g/cm³) | Carbosphere Microballoons (gms) | HM-S 50 (50μ) graphite fiber (gms) | ¼ mm HM-S 50 graphite fiber (gms) | C15/250 glass microballoons (gms) | Titanate Sizing Agent KR238M (gms) | Titanate Sizing Agent KR55 (gms) |
|---|---|---|---|---|---|---|---|
| A | 0.543 | 50 | 50 | — | — | 1 | — |
| B | 0.328 | 20 | 15 | — | 10 | — | 0.5 |
| C | 0.387 | — | 4.4 | 45.6 | 25 | 1 | — |

TABLE VIII

PHYSICAL PROPERTIES OF MOLDED COMPOSITE SLABS

| Filler Used in Molded Sample | Thickness (in.) | Density (gm/cm²) | Filler Ratio (Wt. %) | Filler Ratio (Vol. %) | Resin Bleed % | Cu Coating Removed |
|---|---|---|---|---|---|---|
| A | 0.443 | 1.050 | 39 | 59 | 51.0 | ≦5% |
| B | 0.540 | 0.753 | 26–47 | 56–77 | 61.9 | ≦5% |
| C | 0.850 | 0.948 | 27 | 54 | 16.2 | 5–15% |

In addition, the surfaces of the molded composite slabs of Table VIII were then subjected to plasma treatment under the following conditions: $O_2$/inert gas source of approximately 1000 ml/minute, vacuum pressure of 200μ Hg, and one hour duration. The surfaces of the plasma etched slabs were then copper plated to a thickness of about 3–4 mils by dipping the etched slabs in an aqueous Shipley #328 electroless copper plating bath.

The plated composite was then evaluated for adhesion of the deposited copper layer using the ASTM D3359 tape adhesion test and thermal shock cycle of Example 3. The adhesion results are recorded in Table VIII, indicating the amount of copper coating on lattice removed by the tape.

EXAMPLE 5

A syntactic foam composite prepared from Specimen No. 2 of Table V described in Example 3 and molded in a slab mold was plated with silver as follows. The surface of the slab was subjected to an oxygen rich plasma etch which resulted in the removal of the surface polymer "skin," as previously described. The etched slab was then metallized using the Shipley Company #328 electroless copper plating solution process, as previously described, and thoroughly rinsed and dried at 248° F. (120° C.) under 29 inches (725 mm) Hg (gauge pressure), to provide a layer of electroless copper 20 microinches ($5.08 \times 10^{-5}$ cm) thick. Next, the slab was immersed in an acid copper electrolytic plating bath at 25° C. for 25 minutes to form an electrodeposited copper layer 100 microinches ($2.54 \times 10^{-4}$ cm) thick. Finally, the copper-plated slab was immersed in an electrolytic silver plating bath at 25° C. for 25 minutes to form a layer of silver 300 microinches ($7.62 \times 10^{-4}$ cm) thick.

The silver-plated slab was then evaluated for adhesion of the deposited layer using an ASTM D3359 tape adhesion test before and after 25 cycles of thermal shock imposed on the plated surface by alternately dipping the plated specimen in liquid nitrogen ($-328°$ F. or $-196°$ C.) for one minute and boiling water (212° F. or 100° C.) for one minute. No adhesion loss of silver was observed.

The silver-plated syntactic foam had the same low R.F. loss characteristics as aluminum when tested for insertion loss at 4.6 gigahertz using standard electronic tests. Thus, with the use of proper tooling for molding, antenna waveguide structures may be formed from the composite of the present invention, which are effective microwave or antenna components and which meet the requirements for use in space applications. Syntactic foams plated with metals such as silver and copper may serve as metal-plated core materials for both microwave components and microwave reflectors.

The fiber-reinforced syntactic foam composites of the present invention achieve a 3-to-1 reduction in weight in comparison with aluminum, which makes these components attractive for weight-sensitive applications in a spacecraft environment. At the same time, however, in situations calling for high volume production, the readily-moldable nature of the reinforced foam mixture disclosed herein further offers the potential of significantly reduced cost in comparison with the machining traditionally employed for the production of conventional metal parts.

The preceding description has presented in detail exemplary preferred ways in which the concepts of the present invention may be applied. Those skilled in the art will recognize that numerous alternatives encompassing many variations may readily be employed without departing from the intention and scope of the invention set forth in the appended claims. In particular, the present invention is not limited to the specific resin, fibers, or microballoons set forth herein as examples. By following the teachings provided herein relating to the effect of each component of the mixture on the final composite and the effect of the various components on each other, other suitable resin, fiber, and microballoon materials may readily be determined. Further, by following the teachings provided herein, it may be determined how to form composite materials having a density or coefficient of thermal expansion other than those set forth herein as required for the specifically mentioned end use in space applications.

What is claimed is:

1. A fiber-reinforced syntactic foam composite having a specific gravity less than 1.0 and a coefficient of thermal expansion of about $25 \times 10^{-6}$ in/in/°F. ($45 \times 10^{-6}$ cm/cm/°C.) or less and being suitable for use in the outer space environment, the composite being prepared from an admixture comprising a heat curable thermosetting resin, hollow microspheres having a diameter in the range of about 5 to about 200 micrometers and fibers having a length less than or equal to 250 micrometers.

2. The composite of claim 1 wherein the resin comprises a material selected from the group consisting of an epoxy, a polyester and a condensate of formaldehyde.

3. The composite of claim 2 wherein the heat curable thermosetting resin comprises a mixture of an epoxy resin and a polyfunctional curing agent.

4. The composite of claim 3 wherein the epoxy resin is tetraglycidyl methylene dianiline.

5. The composite of claim 3 wherein the epoxy resin comprises a mixture of diglycidyl orthotoluidine and tetraglycidyl methylene dianiline.

6. The composite of claim 3 wherein the epoxy resin is the diglycidyl ether of Bisphenol A.

7. The composite of claim 3 wherein the epoxy resin is a phenol formaldehyde novolac polyglycidyl ether.

8. The composite of claim 3 wherein the polyfunctional curing agent is a polyamine.

9. The composite of claim 3 wherein the polyfunctional curing agent is a polycarboxylic acid anhydride.

10. The composite of claim 9 wherein the polycarboxylic acid curing agent is the maleic anhydride adduct of methyl cyclopentadiene.

11. The composite of claim 3 wherein the mixture further comprises benzyldimethylaniline as an accelerator.

12. The composite of claim 1 wherein the hollow microspheres are formed of a material selected from the group consisting of glass, silica, carbon, acrylate resins, and phenolic resins.

13. The composite of claim 12 wherein the hollow microspheres are formed of glass and have an average diameter of about 50 micrometers.

14. The composite of claim 12 wherein the hollow microspheres comprise a mixture of glass microspheres and carbon microspheres.

15. The composite of claim 1 wherein the fibers are formed of a material selected from the group consisting of graphite, glass, carbon, nylon, and polyamide.

16. The composite of claim 15 wherein the fibers are formed of graphite and have a length of about 50 micrometers and a diameter of about 8 micrometers.

17. The composite of claim 1 wherein said admixture further includes a coupling and wetting agent.

18. The composite of claim 1 wherein the admixture further includes solid microbeads.

19. The composite of claim 1 which comprises about 35 to about 65 percent by volume microspheres and about 3 to about 10 percent by volume fibers, the balance being a matrix comprised of the heat cured resin throughout which the microspheres and fibers are dispersed and bonded together.

20. The composite of claim 19 which additionally comprises about 2 to about 8 percent by volume of solid microbeads having a diameter of about 2 to about 8 micrometers.

21. The composite of claim 1 wherein:
(a) the heat curable thermosetting resin comprises a mixture of diglycidyl orthotoluidene, tetraglycidyl methylene dianiline, nadic methyl anhydride, and benzyldimethylaniline;
(b) the hollow microspheres are glass microspheres having a mean diameter of 50 micrometers;
(c) the fibers are graphite fibers having a length of about 50 micrometers and a diameter of about 8 micrometers; and
(d) the admixture further comprises solid glass microbeads having a median diameter of 3 micrometers.

22. A fiber-reinforced syntactic foam composite having a specific gravity less than 1.0 and a coefficient of thermal expansion of about $13 \times 10^{-6}$ in/in/°F. ($23 \times 10^{-6}$ cm/cm/°C.) or less and being suitable for use in the outer space environment, said composite comprising:
(a) a heat curable thermosetting epoxy resin comprising a mixture of tetraglycidyl methylene dianiline, nadic methyl anhydride, and benzyldimethylaniline;
(b) hollow glass microspheres having a mean diameter of about 75 micrometers; and
(c) graphite fibers having a length of about 150 micrometers and a diameter of about 8 micrometers.

23. An article of manufacture comprising a body formed from the composite material of claim 1.

24. The article of manufacture set forth in claim 23 which further comprises a layer of electrically conductive material adhered to selected surfaces of the body.

25. The article of manufacture set forth in claim 24 wherein said article comprises a component in an antenna structure.

26. A method for fabricating a fiber-reinforced syntactic foam composite which comprises the steps of:
(a) admixing a heat curable thermosetting resin, hollow microspheres having a diameter in the range of about 5 to about 200 micrometers and fibers having a length less than or equal to 250 micrometers to form a mixture of the resin, microspheres and fibers; and
(b) curing the mixture of the resin, microspheres, and fibers in a mold of predetermined geometry to a thermoset state to provide a composite structure containing about 35 to about 65 volume percent microspheres and about 3 to about 10 volume percent fibers disposed throughout the resin matrix, and the resin comprising the balance of the composite, wherein the composite has a specific gravity of less than 1.0 and a coefficient of thermal expansion about $13 \times 10^{-6}$ in/in/°F. ($23 \times 10^{-6}$ cm/cm/°C.) or less and is suitable for use in the outer space environment.

27. The method of claim 26 wherein the admixing comprises:
(a) forming a liquid dispersion of the microspheres and fibers in a coupling agent;
(b) filtering the dispersion to separate the microspheres and fibers from the liquid as a filtration residue;
(c) drying the residue to provide a mixture of microspheres and fibers coated with the coupling agent; and
(d) admixing the coated microspheres and fibers with the resin.

28. The method of claim 27 wherein:
(a) the microspheres are hollow glass microspheres;
(b) the fibers are graphite fibers;
(c) the coupling agent is selected from the group consisting of a silane compound and a titanate compound.

29. The method of claim 26 wherein the heat curable thermosetting resin is a mixture of an epoxy resin and a polyfunctional curing agent.

30. The method of claim 29 wherein the epoxy resin is tetraglycidyl methylene dianiline.

31. The method of claim 29 wherein the epoxy resin comprises a mixture of diglycidyl orthotoluidene and tetraglycidyl methylene dianiline.

32. The method of claim 29 wherein the epoxy resin is the diglycidyl ether of Bisphenol A.

33. The method of claim 29 wherein the epoxy resin is a phenol formaldehyde novolac polyglycidyl ether.

34. The method of claim 29 wherein the polyfunctional curing agent is a polyamine.

35. The method of claim 29 wherein the polyfunctional curing agent is a polycarboxylic acid anhydride.

36. The method of claim 35 wherein the polycarboxylic acid curing agent is the maleic anhydride adduct of methyl cyclopentadiene.

37. The method of claim 29 wherein the mixture further comprises benzyldimethylaniline as an accelerator.

38. The method of claim 26 wherein the hollow microspheres comprise glass microspheres.

39. The method of claim 26 wherein the fibers comprise graphite fibers.

* * * * *